United States Patent
In et al.

(10) Patent No.: US 9,805,820 B2
(45) Date of Patent: Oct. 31, 2017

(54) SCANLINE DRIVER AND DISPLAY DEVICE INCLUDING THE SAME

(71) Applicant: SAMSUNG DISPLAY CO., LTD., Yongin, Gyeonggi-Do (KR)

(72) Inventors: Hai-Jung In, Seoul (KR); Hae-Yeon Lee, Bucheon-si (KR)

(73) Assignee: Samsung Display Co., Ltd., Yongin, Gyeonggi-do (KR)

(*) Notice: Subject to any disclaimer, the term of this patent is extended or adjusted under 35 U.S.C. 154(b) by 55 days.

(21) Appl. No.: 14/670,708

(22) Filed: Mar. 27, 2015

(65) Prior Publication Data
US 2016/0140903 A1 May 19, 2016

(30) Foreign Application Priority Data
Nov. 13, 2014 (KR) .................. 10-2014-0157819

(51) Int. Cl.
*G11C 19/28* (2006.01)
*G09G 3/20* (2006.01)

(52) U.S. Cl.
CPC .............. *G11C 19/28* (2013.01); *G09G 3/20* (2013.01); *G09G 2310/0267* (2013.01); *G09G 2310/0286* (2013.01); *G09G 2310/0291* (2013.01); *G09G 2310/08* (2013.01)

(58) Field of Classification Search
CPC .... G11C 9/28; G09G 3/20; G09G 2310/0267; G09G 2310/0286; G09G 2310/0291; G09G 2310/08
See application file for complete search history.

(56) References Cited

U.S. PATENT DOCUMENTS

| 2005/0206585 A1 | 9/2005 | Stewart et al. |
| 2010/0201659 A1* | 8/2010 | Miyake ................ G09G 3/3677 345/205 |
| 2012/0313844 A1* | 12/2012 | Im ....................... H01L 27/3216 345/76 |
| 2014/0361961 A1* | 12/2014 | Takahara ............... G09G 3/006 345/76 |

FOREIGN PATENT DOCUMENTS

| KR | 10-2007-0022550 A | 2/2007 |
| KR | 10-2013-0120283 A | 11/2013 |
| KR | 10-2014-0028999 A | 3/2014 |
| KR | 10-2014-0047465 A | 4/2014 |

* cited by examiner

Primary Examiner — Sahlu Okebato
(74) Attorney, Agent, or Firm — Lee & Morse, P.C.

(57) ABSTRACT

A scanline driver includes a shift register circuit and an output buffer. The shift register circuit provides a register output signal and a plurality of signals based on a scan input signal and a plurality of clock signals. The shift register circuit is arranged at at least one horizontal side of a pixel circuit region and includes a plurality of unit pixel circuits connected to a scanline. The output buffer provides a scanline enable signal to the scanline based on the register output signal and the plurality of signals. The output buffer is arranged at at least one vertical side of the pixel circuit region in a pixel array.

20 Claims, 15 Drawing Sheets

SCANLINE DRIVER AND DISPLAY DEVICE INCLUDING THE SAME

CROSS-REFERENCE TO RELATED APPLICATION

Korean Patent Application No. 10-2014-0157819, filed on Nov. 13, 2014, and entitled, "Scanline Driver and Display Device Including the Same," is incorporated by reference herein in its entirety.

BACKGROUND

1. Field

The described technology generally relates to a display device, and more particularly to a scanline driver and a display device including the scanline driver.

2. Description of the Related Art

Developing a display device with higher performance and speed continues to be a focus of system designers. One way to obtain higher performance and speed is to reduce the size of the display circuits or to increase the level of integration.

SUMMARY

In accordance with one or more embodiments, a scanline driver includes a shift register circuit to provide a register output signal and a plurality of signals based on a scan input signal and a plurality of clock signals, the shift register circuit at at least one horizontal side of a pixel circuit region, the pixel circuit region including a plurality of unit pixel circuits connected to a scanline; and an output buffer to provide a scanline enable signal to the scanline based on the register output signal and the plurality of signals, the output buffer at at least one vertical side of the pixel circuit region in a pixel array.

The at least one horizontal side may be one of a right side or a left side of the pixel circuit region, and the at least one vertical side may be at one of an upper side or a lower side of the pixel circuit region. The shift register circuit may include a first shift register circuit and a second shift register circuit, the first shift register circuit at a first horizontal side of the pixel region and the second shift register circuit at a second horizontal side of the pixel region, and the output buffer may include a first output buffer and a second output buffer at at least one vertical side.

The first horizontal side may be at a left side of the pixel circuit region, the second horizontal side may be at a right side of the pixel circuit region, and the at least one vertical side may be one of an upper side or a lower side of the pixel circuit region. The first output buffer may be at a lower side of the pixel circuit region, and the second output buffer may be at an upper side of the pixel circuit region. The shift register and the output buffer may include p-type transistors. The shift register and the output buffer may include n-type transistors.

In accordance with one or more other embodiments, a scanline driver includes a shift register circuit to provide a register output signal and a plurality of signals based on a scan input signal and a plurality of clock signals, the shift register circuit at at least one horizontal side of a pixel circuit region, the pixel circuit region including a plurality of unit pixel circuits connected to a scanline; and an output buffer to provide a scanline enable signal to the scanline based on the register output signal and the plurality of signals, the output buffer including: a capacitor circuit between the at least one horizontal side of the pixel circuit region and the shift register circuit, the capacitor circuit including a plurality of capacitors; and a transistor circuit at at least one vertical side of the pixel circuit region in a pixel array, the transistor circuit including a plurality of transistors.

The at least one horizontal side may be one of a right side or a left side of the pixel circuit region, and the at least one vertical side may be one of an upper side or a lower side of the pixel circuit region.

The shift register circuit may include a first shift register circuit and a second shift register circuit, the output buffer may include a first output buffer and a second output buffer, the first output buffer may include a first capacitor circuit and a first transistor circuit, the second output buffer may include a second capacitor circuit and a second transistor circuit, the first shift register circuit and the first capacitor circuit may be at a first horizontal side of the pixel circuit region, the second shift register circuit and the second capacitor circuit may be at a second horizontal side of the pixel circuit region, and the first transistor circuit and the second transistor circuit may be at the at least one vertical side.

The first horizontal side may be a left side of the pixel circuit region, the second horizontal side may be a right side of the pixel circuit region, the at least one vertical side may be one of an upper side or a lower side of the pixel circuit region. The first transistor unit may be at a lower side of the pixel circuit region, and the second transistor circuit may be at an upper side of the pixel circuit region. The shift register circuit and the transistor circuit may include p-type transistors or n-type transistors.

In accordance with one or more other embodiments, a display device includes a plurality of scanline drivers to provide a scan enable signal to a plurality of scanlines based on a scan input signal and a plurality of clock signals; and a pixel circuit including a plurality of unit pixel circuits to drive organic light emitting diodes, the unit pixel circuits connected the scanlines, each scanline driver including: shift register circuit to provide a register output signal and a plurality of signals based on the scan input signal and the plurality of clock signals, the shift register circuit at at least one horizontal side of a pixel circuit region, the pixel circuit region including unit pixel circuits connected to a corresponding one of the scanlines; and an output buffer to provide the scanline enable signal to the corresponding one of the scanlines based on the register output signal and the plurality of signals, the output buffer at at least one vertical side of the pixel circuit region in a pixel array.

An area of each of the unit pixel circuits may be substantially constant. A horizontal direction length of each of parallel unit pixel circuits may be greater than a horizontal direction length of each of non-parallel unit pixel circuits, the parallel unit pixel circuits may be in parallel with the output buffer, and the non-parallel unit pixel circuits may be different from the parallel unit pixel circuits.

An area of each of parallel unit pixel circuits may be less than an area of each of non-parallel unit pixel circuits, the parallel unit pixel circuits may be in parallel with the output buffer, and the non-parallel unit pixel may be different from the parallel unit pixel circuits. The area of each of the non-parallel unit pixel circuits may increase with increasing distance between the shift register circuit and each of the non-parallel unit pixel circuits. The parallel unit pixel circuits may receive the scanline enable signal from the output buffer. The non-parallel unit pixel circuits may receive the scan enable signal through a scanline connected to the output buffer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
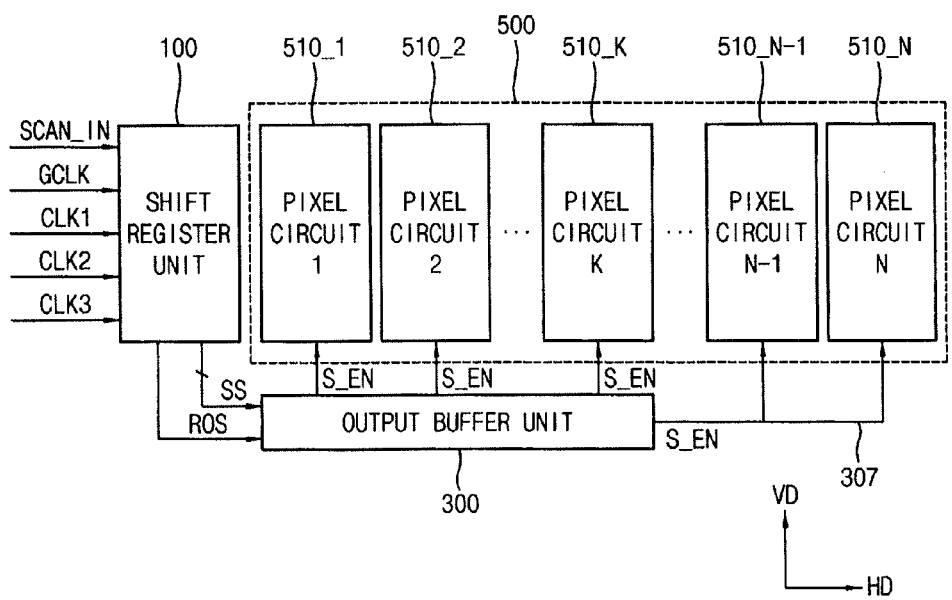
FIG. 1 illustrates an embodiment of a scanline driver.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. Like reference numerals refer to like elements throughout. Embodiments may be combined to form other embodiments.

Figure 2:
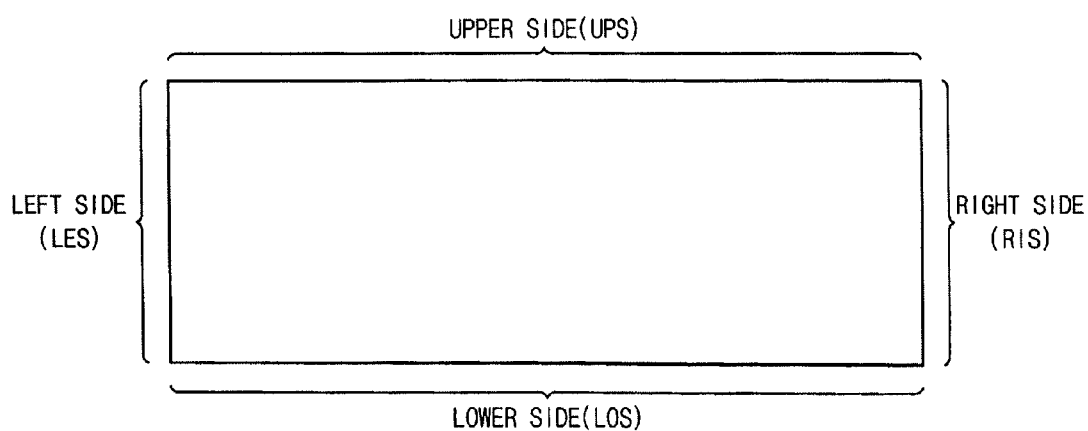
FIG. 2 illustrates an embodiment of a pixel circuit region in FIG. 1.

FIG. 1 illustrates an embodiment of a scanline driver 10a, and FIG. 2 illustrates an embodiment of a pixel circuit region 500 in FIG. 1. Referring to FIGS. 1 and 2, the scanline driver 10a includes a shift register unit 100 and an output buffer unit 300.

The shift register unit 100 provides a register output signal ROS and a plurality of signals SS based on a scan input signal SCAN_IN and a plurality of clock signals GCLK and CLK1 to CLK3. The shift register unit 100 is at one or more horizontal sides of the pixel circuit region 500. The pixel circuit region 500 includes a plurality of unit pixel circuits 510_1 to 510_N connected to a scanline 307. For example, a 1st to n-th unit pixel circuits 510_1 to 510_N may be in the pixel circuit region 500.

The pixel circuit region 500 may include a left side LES, a right side RIS, an upper side UPS, and a lower side LOS. The horizontal side may be sides of the pixel circuit region 500 that cross an extended line according to the horizontal direction HD. The sides of the pixel circuit region 500 that cross the extended line according to the horizontal direction HD may be the left side LES and the right side RIS. Therefore, the horizontal sides may be the left side LES and the right side RIS. In an example embodiment, the horizontal side where the shift register unit 100 is placed may be one side of a right side RIS and a left side LES of the pixel circuit region 500. The unit pixel circuit may be a circuit part except an organic light emitting diodes in a unit pixel.

The output buffer unit 300 provides a scanline enable signal S_EN to the scanline 307 based on the register output signal ROS and the plurality of signals SS. The output buffer unit 300 is placed in at least one vertical side of the pixel circuit region 500 in a pixel array. The vertical side may be sides of the pixel circuit region 500 that cross an extended line according to the vertical direction VD. The sides of the pixel circuit region 500 that cross the extended line according to the vertical direction VD may be the upper side UPS and the lower side LOS. Therefore, the vertical sides may be the upper side UPS and the lower side LOS. In an example embodiment, the vertical side where the output buffer unit 300 is placed may be one side of an upper side UPS and a lower side LOS of the pixel circuit region 500.

An area of the output buffer unit 300 in the scanline driver 10a may be greater than an area of the shift register unit 100 in the scanline driver 10a. The output buffer unit 300 in the scanline driver 10a may be placed in the pixel array. In one embodiment, the scanline driver 10a may decrease an area of scanline driver 10a in a display edge by placing an output buffer unit 300 in a vertical side of the pixel circuit region 500 in a pixel array.

Figure 3:
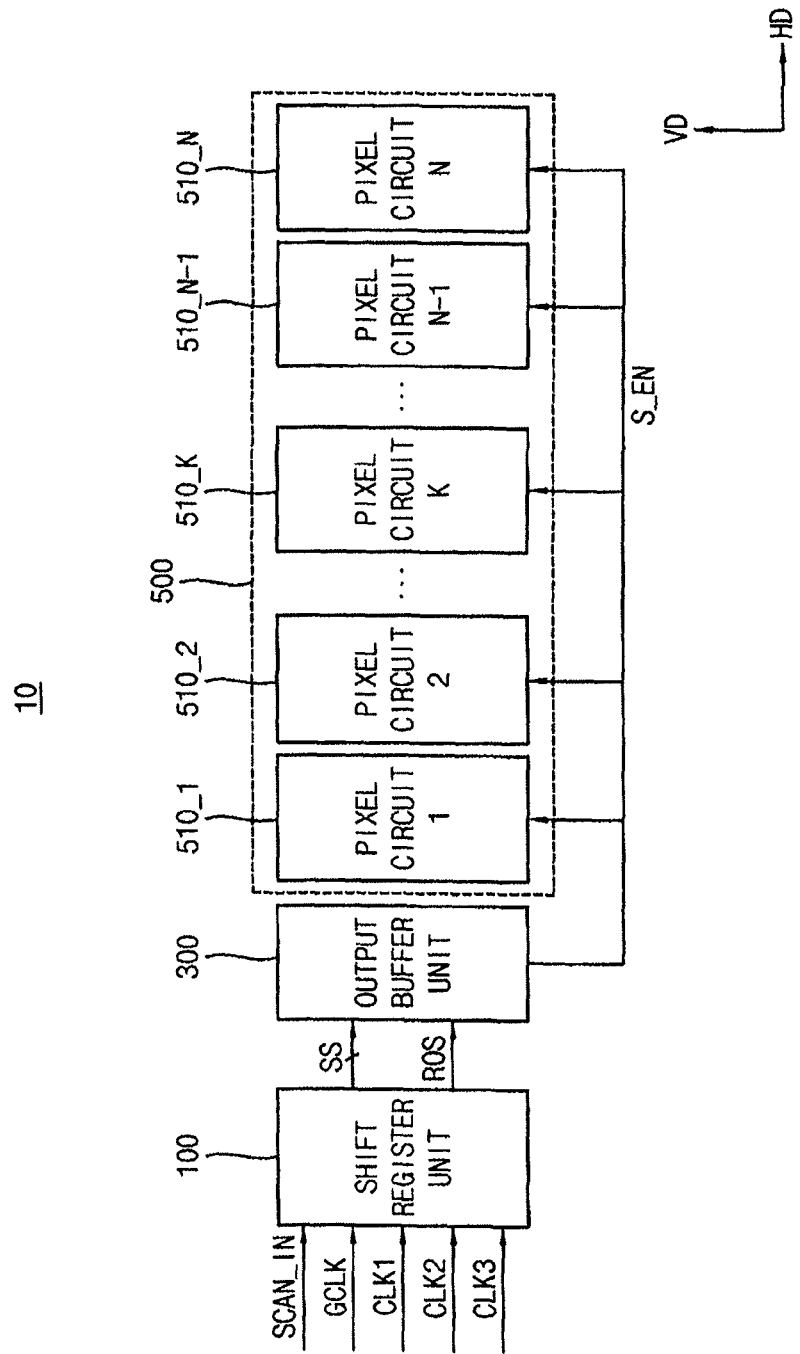
FIG. 3 illustrates placement of another type of scanline driver.

FIG. 3 illustrates an example of the placement of another type of scanline driver 10. Referring to FIGS. 1 and 3, the other type of scanline driver 10 includes a shift register unit 100 and an output buffer unit 300. The shift register unit 100 provides a register output signal ROS and a plurality of signals SS based on a scan input signal SCAN_IN and a plurality of clock signals GCLK and CLK1 to CLK3. The shift register unit 100 is at at least one horizontal side of a pixel circuit region 500. The pixel circuit region 500 includes a plurality of unit pixel circuits 510_1 to 510_N connected to a scanline 307.

The output buffer unit 300 provides a scanline enable signal S_EN to the scanline 307 based on the register output signal ROS and the plurality of signals SS. The output buffer unit 300 is at at least one horizontal side of the pixel circuit region 500 in a pixel array. The area of the output buffer unit 300 in the scanline driver 10 is greater than the area of the shift register unit 100 in the scanline driver 10. The scanline driver 10 may increase the area of the scanline driver 10 in the display edge by placing the output buffer unit 300 in the horizontal side of the pixel circuit region 500 in the pixel array.

However, according to one example embodiment, the scanline driver 10a may decrease an area of scanline driver 10a in a display edge by placing an output buffer unit 300 at a vertical side of the pixel circuit region 500 in a pixel array.

Figure 4:
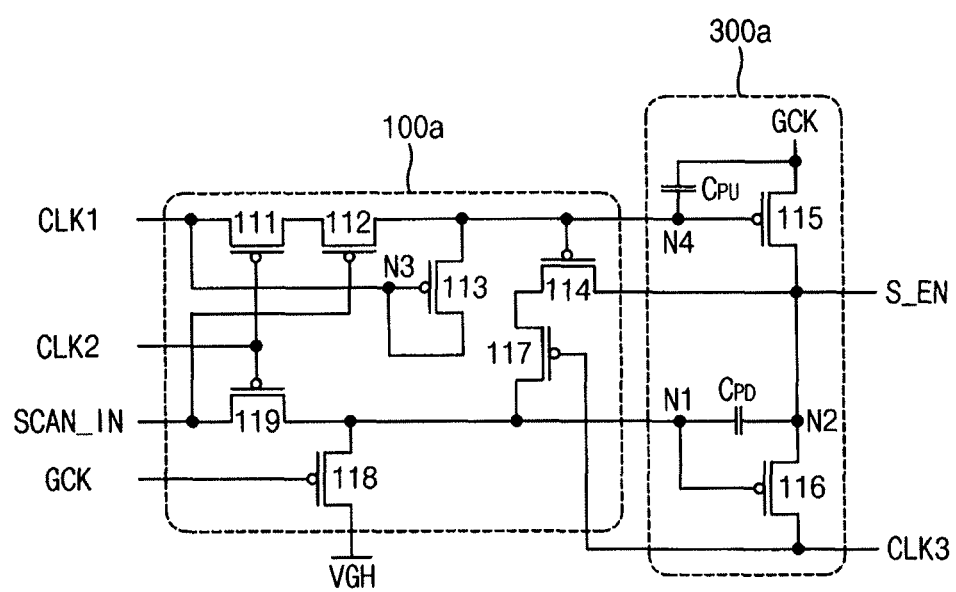
FIG. 4 illustrates an embodiment of a shift register unit and an output buffer unit.
Figure 5:
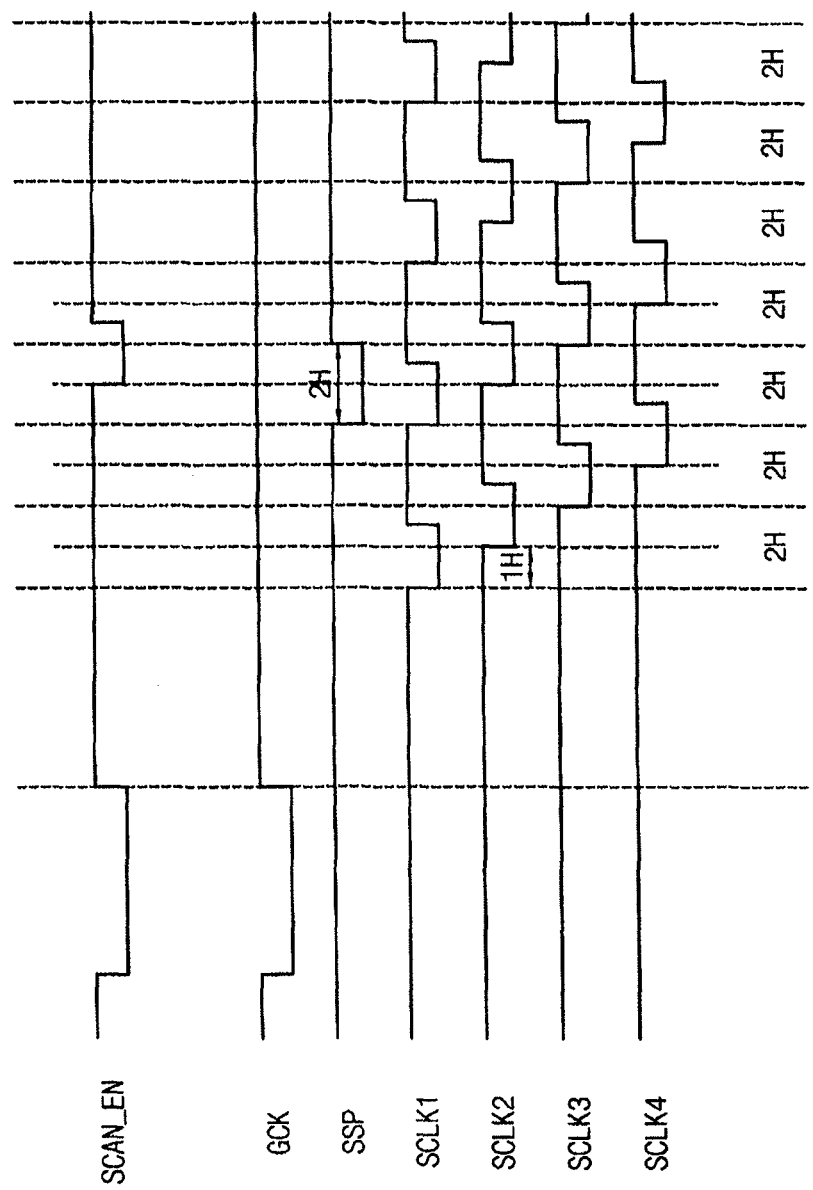
FIG. 5 illustrates an example of control signals for the scanline driver in FIG. 1.
Figure 6:
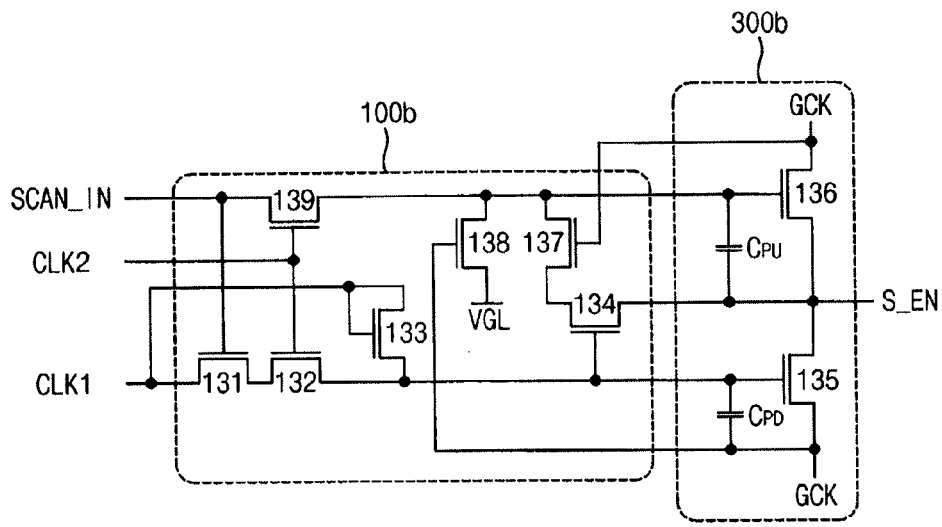
FIG. 6 illustrates another embodiment of a shift register unit and output buffer unit.

FIG. 4 illustrates an embodiment of a shift register unit 100a and an output buffer unit 300a in the scanline driver of FIG. 1. FIG. 5 is a timing diagram illustrating control signals for the scanline driver of FIG. 1. FIG. 6 illustrates another example of a shift register unit and an output buffer unit in the scanline driver of FIG. 1.

Referring to FIGS. 4 and 5, the scanline driver 10a includes a shift register unit 100a and an output buffer unit 300a. The scanline driver 10a may include the plurality of scan transistors 111 to 119. The scan transistors 111 to 119 may be implemented using, for example, p-type transistors. The scanline driver 10a provides scanline enable signal S_EN based on the clock signals CLK1 to CLK3, the global clock signal GCLK and the scan input signal SCAN_IN during the scan time interval SCTI. The clock signals CLK1 to CLK3 may be selected among a first to fourth S-clock signals SCLK1 to SCLK4.

For example, the first clock signal CLK1 of the clock signals CLK1 to CLK3 may be the fourth S-clock signal SCLK4, the second clock signal CLK2 of the clock signals CLK1 to CLK3 may be the first S-clock signal SCLK1, and the third clock signal CLK3 of the clock signals CLK1 to CLK3 may be the second S-clock signal SCLK2. The scan input signal SCAN_IN may be a scan start pulse SSP.

When the first clock signal CLK1 is at a logic low level, the first scan transistor 113 connected to the third node N3 may be turned-on. When the first scan transistor 113 is turned-on, the fourth node N4 may be at the logic low level. When the fourth node N4 is at the logic low level, the second scan transistor 115 may be turned-on. When the second scan transistor 115 is turned-on, the scanline enable signal S_EN may be at a logic high level.

Subsequently, the scan input signal SCAN_INm that is the scan start pulse SSP, may be at the logic low level and the second clock signal CLK2 may be at the logic low level. When the second clock signal CLK2 is at the logic low level, the third scan transistor 119 may be turned-on. When the third scan transistor 119 is turned-on, the scan input signal SCAN_IN, that is at the logic low level, may be transferred to the first node N1. When the first node N1 is at the logic low level, the fourth scan transistor 116 may be turned-on. When the fourth scan transistor 116 is turned-on, the scanline enable signal S_EN may be the third clock signal CLK3. In this case, the scanline enable signal S_EN may be at the logic low level.

Referring to FIG. 6, the scanline driver 10a includes the shift register unit 100b and the output buffer unit 300b. The scanline driver 10a may include the scan transistors 131 to 139. The scan transistors 131 to 139 may be implemented, for example, using n-type transistors. Operation of the scanline driver of FIG. 6 may be similar to operation of scanline driver of FIGS. 4 and 5.

In an example embodiment, the shift register unit 100 and the output buffer unit 300 may include p-type transistors. In another example embodiment, the shift register unit 100 and the output buffer unit 300 may include n-type transistors.

Figure 7:
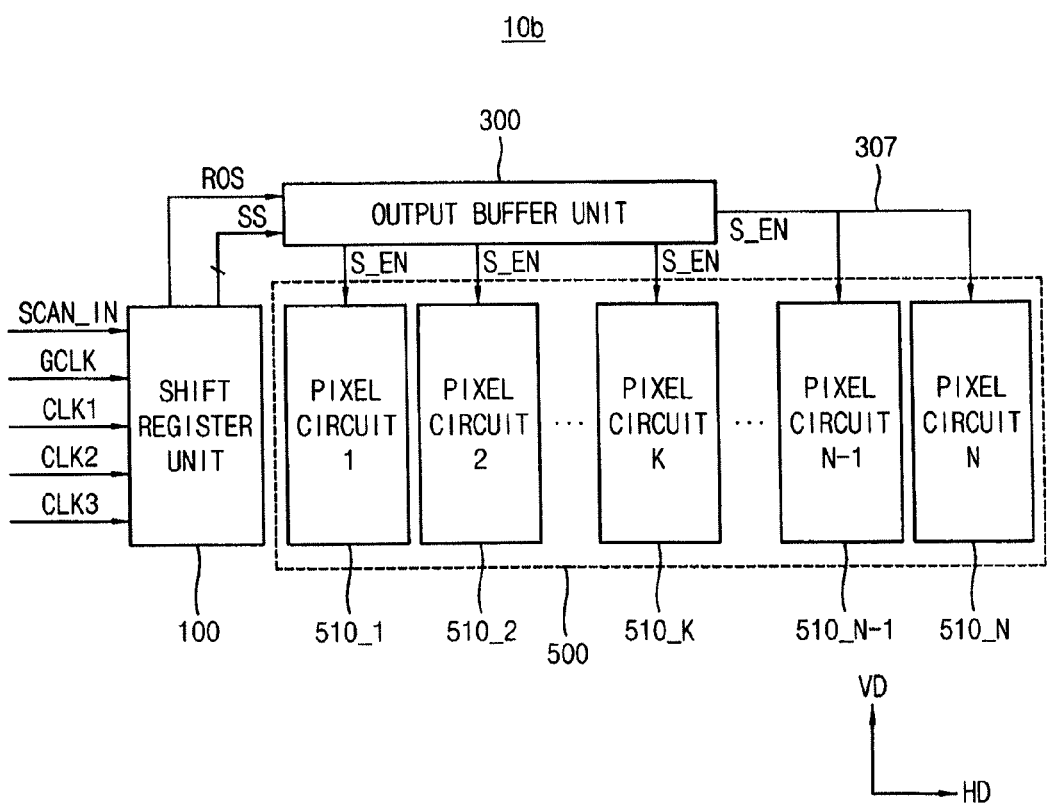
FIGS. 7 to 11 illustrate other embodiments of scanline driver.

FIGS. 7 to 11 illustrate additional embodiments of a scanline driver. Referring to FIGS. 1 and 7, a scanline driver 10b includes a shift register unit 100 and an output buffer unit 300. The shift register unit 100 provides a register output signal ROS and a plurality of signals SS based on a scan input signal SCAN_IN and a plurality of clock signals GCLK and CLK1 to CLK3. The shift register unit 100 is at at least one horizontal side of a pixel circuit region 500.

The pixel circuit region 500 includes a plurality of unit pixel circuits 510_1 to 510_N connected to a scanline 307. The output buffer unit 300 provides a scanline enable signal S_EN to the scanline 307 based on the register output signal ROS and the signals SS. The output buffer unit 300 is at at least one vertical side of the pixel circuit region 500 in a pixel array. For example, the horizontal side where the shift register unit 100 is placed may at the left side LES of the pixel circuit region 500. When the horizontal side where the shift register unit 100 is at the left side LES of the pixel circuit region 500. The vertical side where the output buffer unit 300 is at the lower side LOS of the pixel circuit region 500.

When the horizontal side where the shift register unit 100 is is at the left side LES of the pixel circuit region 500, the vertical side where the output buffer unit 300 is placed may be the upper side UPS of the pixel circuit region 500.

Figure 8:
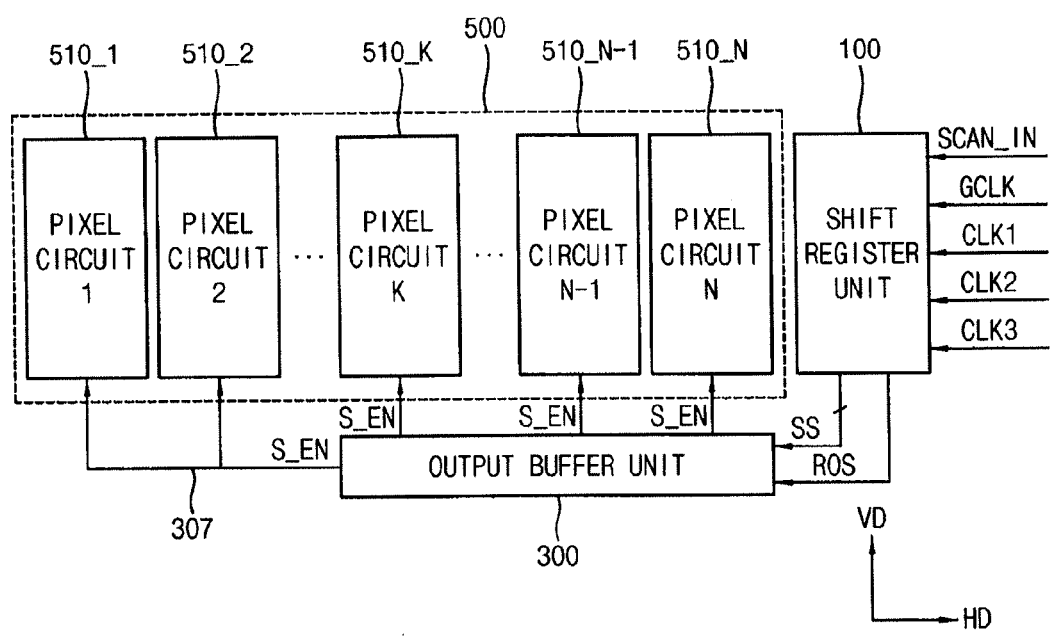
Figure 9:
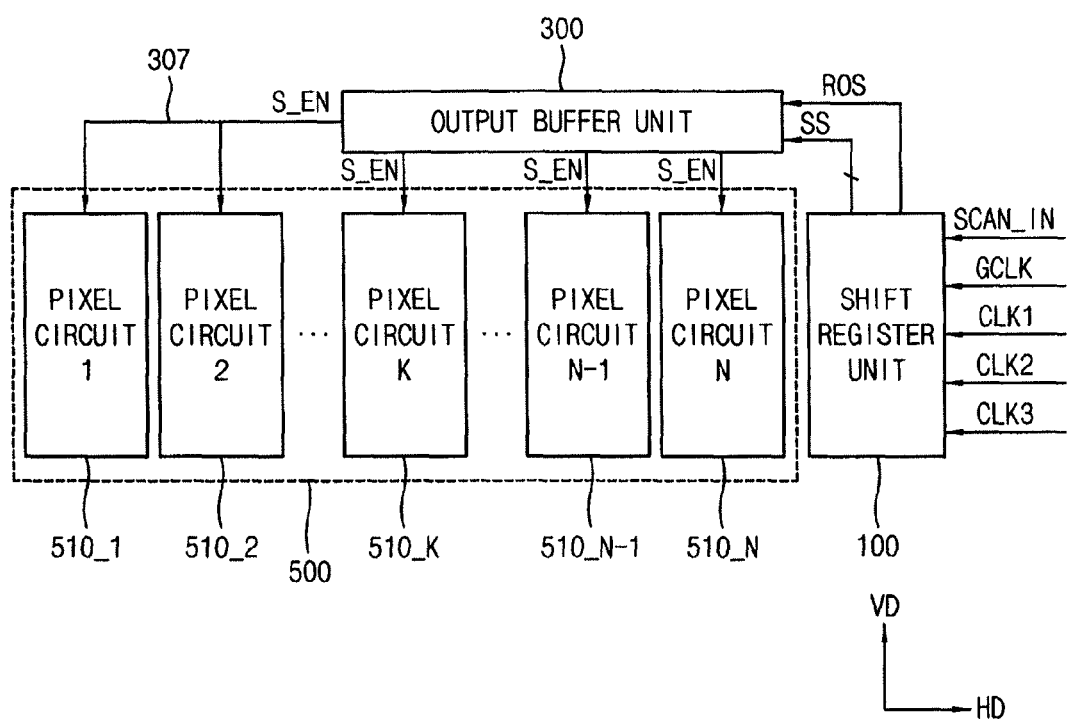

Referring to FIGS. 8 and 9, a scanline driver 10c, 10d includes a shift register unit 100 and an output buffer unit 300. For example, the horizontal side where the shift register unit 100 is placed may be the right side RIS of the pixel circuit region 500. When the horizontal side where the shift register unit 100 is placed is the right side RIS of the pixel circuit region 500, the vertical side where the output buffer unit 300 is placed may be the lower side LOS of the pixel circuit region 500. In this case, the output buffer unit 300 may directly provide the scanline enable signal S_EN to the k-th to n-th unit pixel circuits 510_K to 510_N. The output buffer unit 300 may provide the scanline enable signal S_EN to the 1st to (k−1)-th unit pixel circuits 510_1 to 510_(K−1) through the scanline 307.

In addition, when the horizontal side where the shift register unit 100 is placed is the right side RIS of the pixel circuit region 500, the vertical side where the output buffer unit 300 is placed may be the upper side UPS of the pixel circuit region 500. In this case, the output buffer unit 300 may directly provide the scanline enable signal S_EN to the k-th to n-th unit pixel circuits 510_K to 510_N. The output buffer unit 300 may provide the scanline enable signal S_EN to the 1st to (k−1)-th unit pixel circuits 510_1 to 510_(K−1) through the scanline 307.

Figure 10:
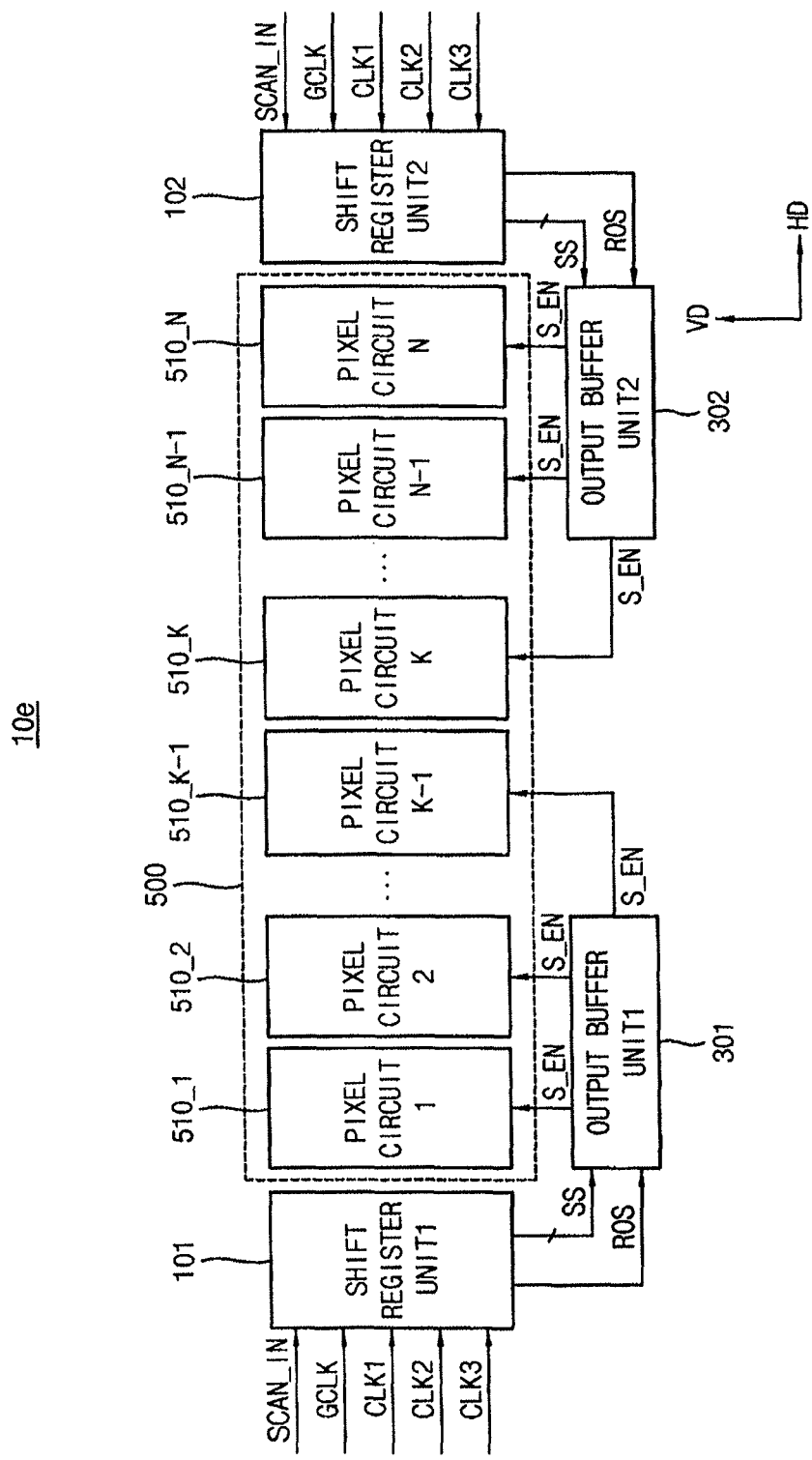
Figure 11:
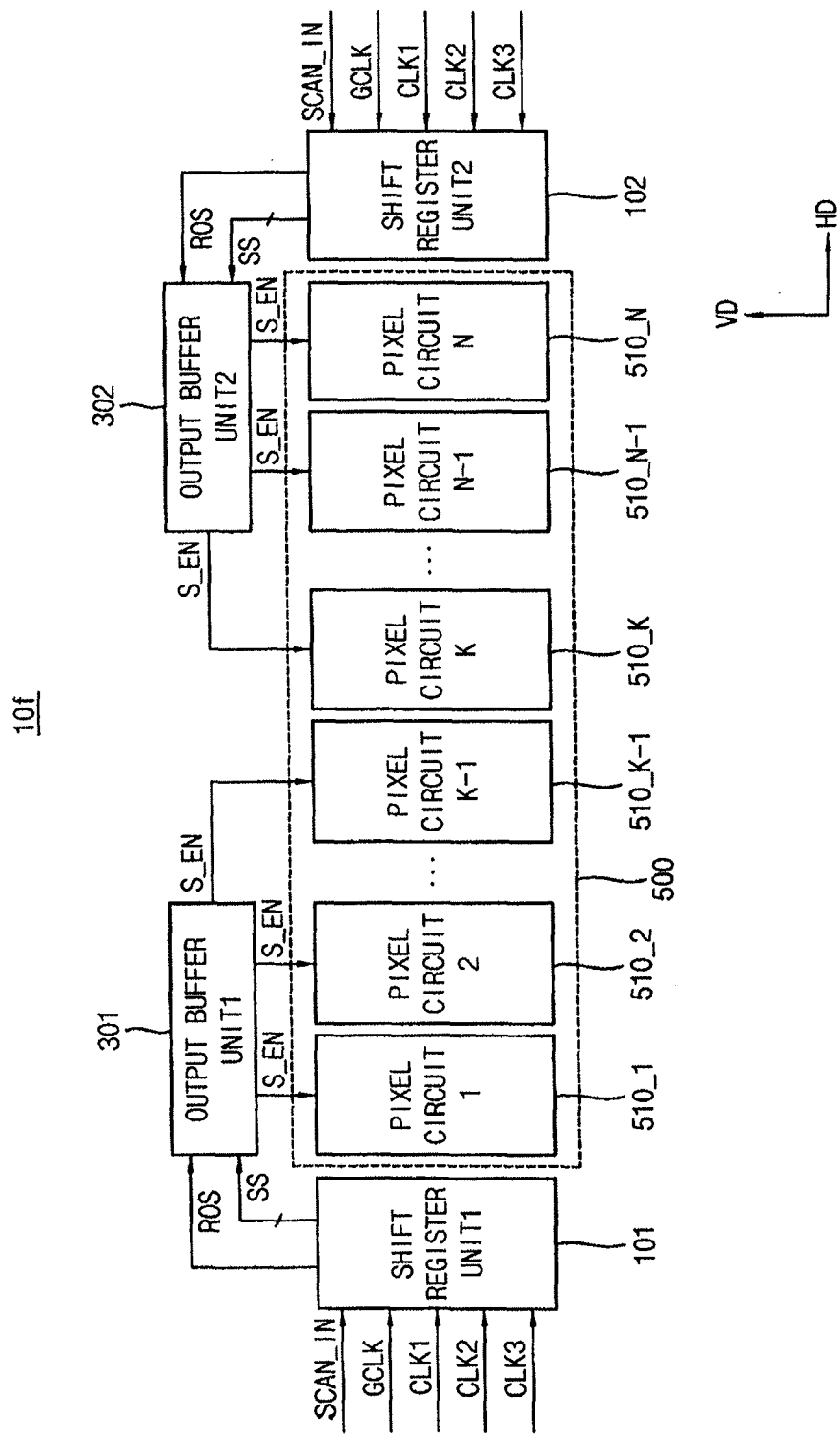

Referring to FIGS. 10 and 11, a scanline driver 10e, 10f includes a shift register unit 100 and an output buffer unit 300. The shift register unit 100 may include a first shift register unit 101 and a second shift register unit 102. The output buffer unit 300 may include a first output buffer unit 301 and a second output buffer unit 302. The first shift register unit 101 may be placed in a first horizontal side of the horizontal sides. The second shift register unit 102 may be placed in a second horizontal side of the horizontal sides. The first output buffer unit 301 and the second output buffer unit 302 may be placed in the at least one vertical side.

For example, the first horizontal side where the first shift register unit 101 is placed may be the left side LES of the pixel circuit region 500. The second horizontal side where the second shift register unit 102 is placed may be the right side RIS of the pixel circuit region 500. The at least one vertical side where the first output buffer unit 301 and the second output buffer unit 302 are placed may be the lower side LOS of the pixel circuit region 500.

In addition, the at least one vertical side where the first output buffer unit 301 and the second output buffer unit 302 are placed may be the upper side UPS of the pixel circuit region 500. In addition, in case the first output buffer unit 301 is placed in the lower side LOS of the pixel circuit region 500, the second output buffer unit 302 may be placed in the upper side UPS of the pixel circuit region 500. In this case, the first output buffer unit 301 may directly provide the scanline enable signal S_EN to the 1st to 2nd unit pixel circuits 510_1, 510_2.

The first output buffer unit 301 may provide the scanline enable signal S_EN to the 3rd to (k−1)-th unit pixel circuits 510_3 to 510_(K−1) through the scanline 307. The second output buffer unit 302 may directly provide the scanline enable signal S_EN to the (n−1)-th to n-th unit pixel circuits 510_(N−1), 510_N. The second output buffer unit 302 may provide the scanline enable signal S_EN to the k-th to (n−2)-th unit pixel circuits 510_K to 510_(N−2) through the scanline 307. The shift register unit 100 and the output buffer unit 300 may include p-type transistors or n-type transistors.

Figure 12:
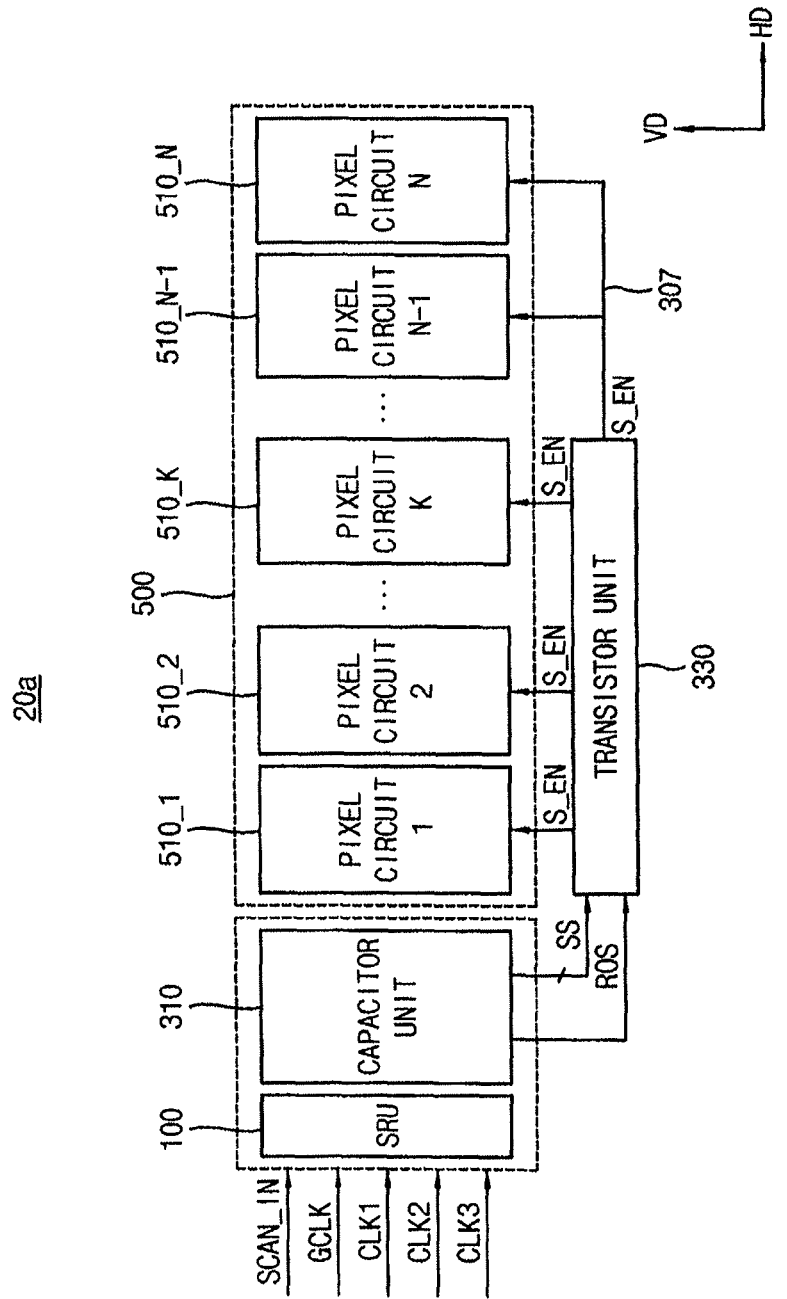
FIG. 12 illustrates another embodiment of a scanline driver.
Figure 13:
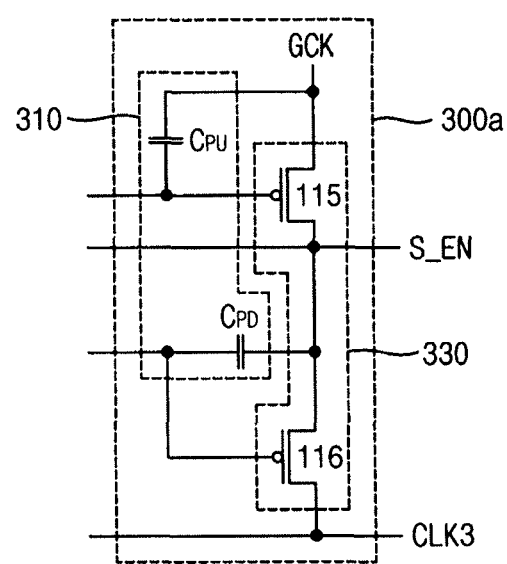
FIG. 13 illustrates an embodiment of capacitor unit and a transistor unit.

FIG. 12 illustrates another embodiment of a scanline driver 20a, and FIG. 13 illustrates embodiments of a capacitor unit 310 and transistor unit 330 in the scanline driver of FIG. 12.

Referring to FIGS. 12 and 13, the scanline driver 20a includes a shift register unit 100 and an output buffer unit 300. The output buffer unit 300 includes a capacitor unit 310 and a transistor unit 330. The shift register unit 100 provides a register output signal ROS and a plurality of signals SS based on a scan input signal SCAN_IN and a plurality of clock signals GCLK and CLK1 to CLK3. The shift register unit 100 is at at least one horizontal side of a pixel circuit region 500. The pixel circuit region 500 includes a plurality of unit pixel circuits 510_1 to 510_N connected to a scanline 307. An output buffer unit 300 provides a scanline enable signal S_EN to the scanline 307 based on the register output signal ROS and the plurality of signals SS.

The capacitor unit 310 is between the at least one horizontal side of the pixel circuit region 500 and the shift register unit 100. The capacitor unit 310 includes a plurality of capacitors. For example, the pixel circuit region 500 may include the 1st to n-th unit pixel circuits 510_1 to 510_N.

The pixel circuit region 500 may include a left side LES, a right side RIS, an upper side UPS, and a lower side LOS. The horizontal side may be sides of the pixel circuit region 500 that cross an extended line according to the horizontal direction HD. The sides of the pixel circuit region 500 that cross the extended line according to the horizontal direction HD may be the left side LES and the right side RIS. Therefore, the horizontal sides may be the left side LES and the right side RIS. In an example embodiment, the horizontal side where the shift register unit 100 is placed may be one of a right side RIS or a left side LES of the pixel circuit region 500. The unit pixel circuit may be a circuit part except an organic light emitting diodes in a unit pixel. For example, the horizontal side where the shift register unit 100 and the capacitor unit 310 are placed may be one of a right side RIS or a left side LES of the pixel circuit region 500.

The transistor unit 330 is at at least one vertical side of the pixel circuit region 500 in a pixel array. The transistor unit 330 includes a plurality of transistors. For example, the vertical side where the transistor unit 330 is placed may be one of an upper side UPS or a lower side LOS of the pixel circuit region 500. The capacitor unit 310 in the output buffer unit 300 may include the capacitors. The capacitor unit 310 in the output buffer unit 300 may be sensitive to coupling noise. Therefore, the capacitor unit 310 in the output buffer unit 300 may be placed in the horizontal side of the pixel circuit region 500 to decrease an effect of the coupling noise.

Figure 14:
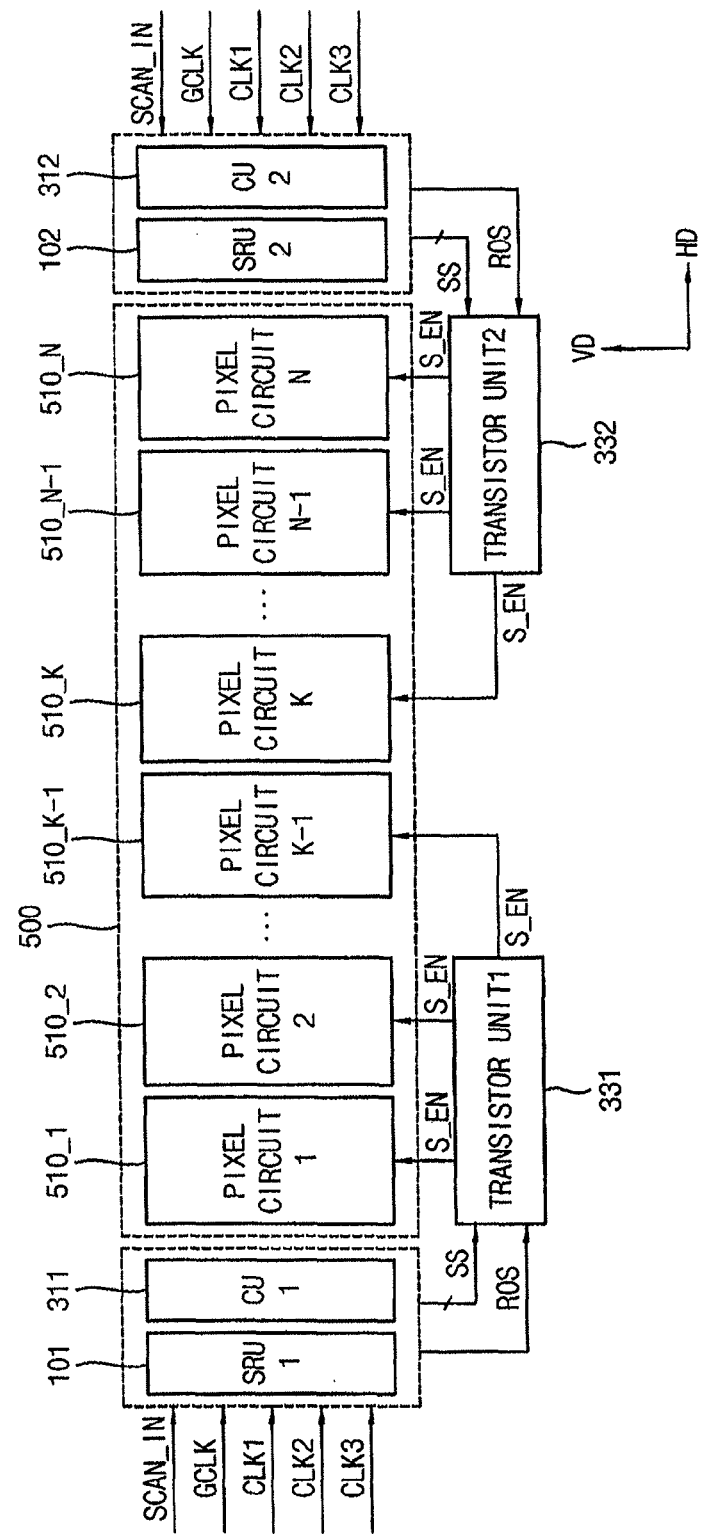
FIG. 14 illustrates another embodiment of a scanline driver.

FIG. 14 illustrates another embodiment of a scanline driver 20b which includes a shift register unit 100 and an output buffer unit 300. The shift register unit 100 may include a first shift register unit 101 and a second shift register unit 102. The output buffer unit 300 may include a first output buffer unit 301 and a second output buffer unit 302. The first output buffer unit 301 may include a first capacitor unit 311 and a first transistor unit 331. The second output buffer unit 302 may include a second capacitor unit 312 and a second transistor unit 332. The first shift register unit 101 and the first capacitor unit 311 may be placed in a first horizontal side of the horizontal sides. The second shift register unit 102 and the second capacitor unit 312 may be placed in a second horizontal side of the horizontal sides.

The first transistor unit 331 and the second transistor unit 332 may be placed at the at least one vertical side. For example, the first horizontal side where the first shift register unit 101 and the first capacitor unit 311 are placed may be the left side LES of the pixel circuit region 500. The second horizontal side where the second shift register unit 102 and the second capacitor unit 312 are placed may be the right side RIS of the pixel circuit region 500. The at least one vertical side where the first transistor unit 331 and the second transistor unit 332 are placed may be the lower side LOS of the pixel circuit region 500.

In addition, the at least one vertical side where the first transistor unit 331 and the second transistor unit 332 are placed may be the upper side UPS of the pixel circuit region 500. In addition, when the first transistor unit 331 is placed in the lower side LOS of the pixel circuit region 500, the second transistor unit 332 may be placed in the upper side UPS of the pixel circuit region 500.

In this case, the first transistor unit 331 may directly provide the scanline enable signal S_EN to the 1st to 2nd unit pixel circuits 510_1, 510_2. The first transistor unit 331 may provide the scanline enable signal S_EN to the 3rd to (k-1)-th unit pixel circuits 510_3 to 510_(K-1) through the scanline 307. The second transistor unit 332 may directly provide the scanline enable signal S_EN to the (n-1)-th to n-th unit pixel circuits 510_(N-1), 510_N. The second transistor unit 332 may provide the scanline enable signal S_EN to the k-th to (n-2)-th unit pixel circuits 510_K to 510_(N-2) through the scanline 307. The shift register unit 100 and the transistor unit 330 may include p-type transistors or n-type transistors.

Figure 15:
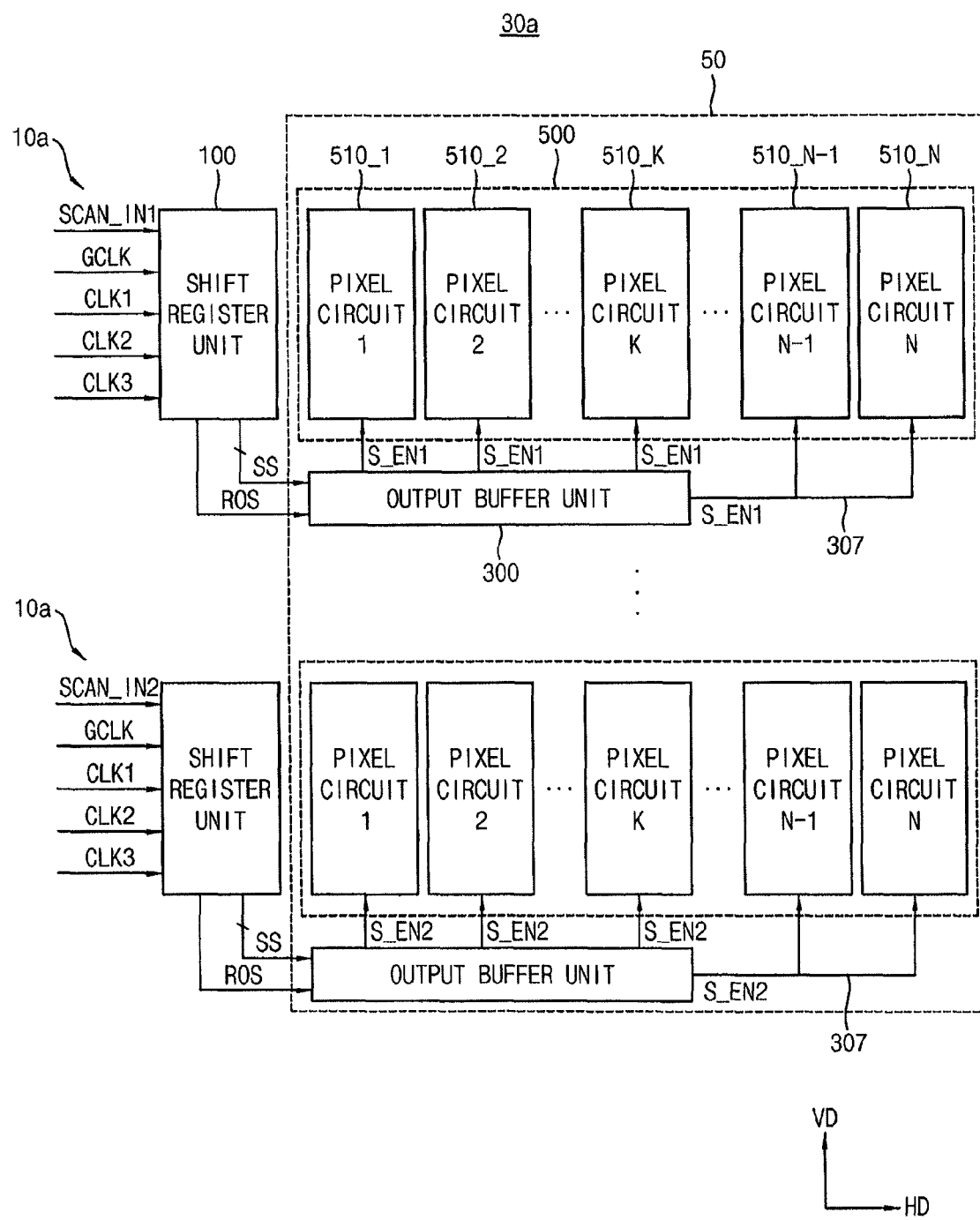
FIG. 15 illustrates an embodiment of a display device.

FIG. 15 illustrates an embodiment of a display device 30a which includes a plurality of scanline drivers 10a and a pixel circuit unit. Each of the scanline drivers 10a includes a shift register unit 100 and an output buffer unit 300. The plurality of scanline drivers 10a provides a scan enable signal to a corresponding scanline based on a scan input signal SCAN_IN and a plurality of clock signals GCLK and CLK1 to CLK3.

The pixel circuit unit includes a plurality of unit pixel circuits 510_1 to 510_N that drive each of organic light emitting diodes. The plurality of unit pixel circuits 510_1 to 510_N are connected the corresponding scanline. The shift register unit 100 provides a register output signal ROS and a plurality of signals SS based on the scan input signal SCAN_IN and the plurality of clock signals GCLK and CLK1 to CLK3. The shift register unit 100 is at at least one horizontal side of a pixel circuit region 500.

The pixel circuit region 500 includes a plurality of unit pixel circuits 510_1 to 510_N connected to a scanline 307. For example, a 1st to n-th unit pixel circuits 510_1 to 510_N may be in the pixel circuit region 500. The pixel circuit region 500 may include a left side LES, a right side RIS, an upper side UPS, and a lower side LOS. The horizontal side may be sides of the pixel circuit region 500 that cross an extended line according to the horizontal direction HD. The sides of the pixel circuit region 500 that cross the extended line according to the horizontal direction HD may be the left side LES and the right side RIS. Therefore, the horizontal sides may be the left side LES and the right side RIS.

In an example embodiment, the horizontal side where the shift register unit 100 is placed may be one of a right side RIS or a left side LES of the pixel circuit region 500. The unit pixel circuit may be a circuit part which excludes an organic light emitting diode in a unit pixel.

The output buffer unit 300 provides the scanline enable signal S_EN to the scanline 307 based on the register output signal ROS and the plurality of signals SS. The output buffer unit 300 is at at least one vertical side of the pixel circuit region 500 in a pixel array. The vertical side may be sides of the pixel circuit region 500 that cross an extended line according to the vertical direction VD. The sides of the pixel circuit region 500 that cross the extended line according to the vertical direction VD may be the upper side UPS and the lower side LOS. Therefore, the vertical sides may be the upper side UPS and the lower side LOS. In an example embodiment, the vertical side where the output buffer unit 300 is placed may be one of an upper side UPS or a lower side LOS of the pixel circuit region 500.

An area of the output buffer unit 300 in the scanline driver 10*a* may be greater than an area of the shift register unit 100 in the scanline driver 10*a*. The output buffer unit 300 in the scanline driver 10*a* may be in the pixel array. According to one embodiment, the scanline driver 10*a* may decrease an area of scanline driver 10*a* in a display edge by placing an output buffer unit 300 in a vertical side of the pixel circuit region 500 in a pixel array.

Figure 16:
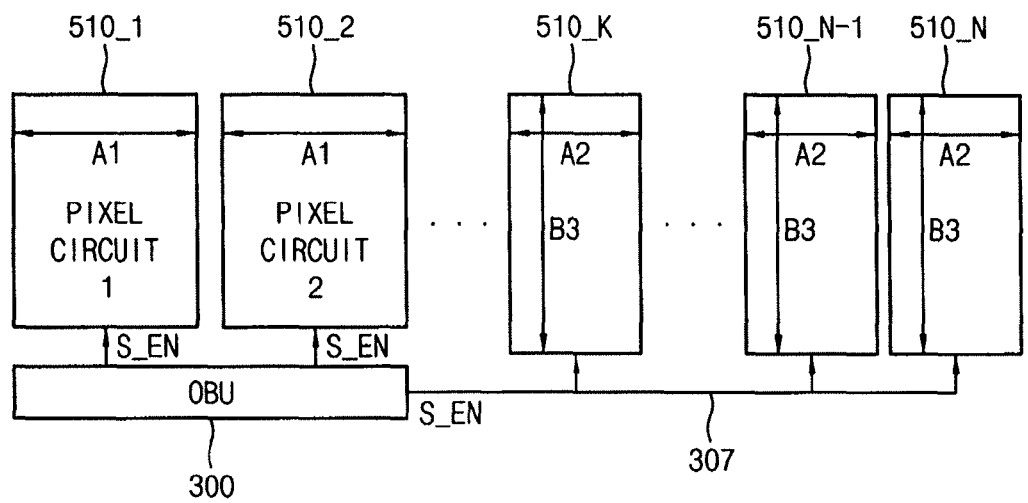
FIGS. 16 and 17 illustrate an embodiment of a horizontal direction length and a vertical direction length of a unit pixel circuit.
Figure 17:
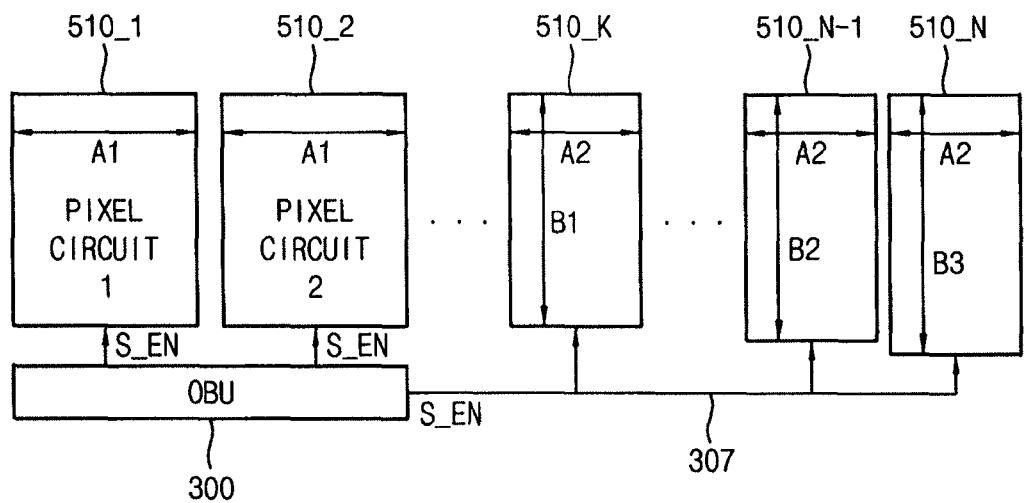

FIGS. 16 and 17 illustrate an embodiment of a horizontal direction length and a vertical direction length of a unit pixel circuit in the display device of FIG. 15. Referring to FIGS. 16 and 17, an area of each of the unit pixel circuits in the display device may be constant.

For example, the horizontal direction length A1 of each of parallel unit pixel circuits 510_1 and 510_2 may be greater than a horizontal direction length A2 of each of non-parallel unit pixel circuits 510_3 to 510_N. The parallel unit pixel circuits 510_1 and 510_2 may be in parallel with the output buffer unit 300 according to the output buffer unit 300. The non-parallel unit pixel circuits 510_3 to 510_N may be the unit pixel circuits except the parallel unit pixel circuits 510_1 and 510_2. In this case, a vertical direction length of each of parallel unit pixel circuits 510_1 and 510_2 may be less than a vertical direction length B3 of each of non-parallel unit pixel circuits 510_3 to 510_N.

If the vertical direction length and the horizontal direction length A1 of each of parallel unit pixel circuits 510_1 and 510_2 are controlled, the area of each of the unit pixel circuits in the display device may be constant. If the vertical direction length and the horizontal direction length A1 of each of of the parallel unit pixel circuits 510_1 and 510_2 are controlled, the space may be provided for the output buffer unit 300 in the pixel array.

In an example embodiment, an area of each of parallel unit pixel circuits 510_1 and 510_2 may be less than an area of each of non-parallel unit pixel circuits 510_3 to 510_N. The parallel unit pixel circuits 510_1 and 510_2 may be in parallel with the output buffer unit 300. The non-parallel unit pixel circuits 510_3 to 510_N may be the unit pixel circuits except the parallel unit pixel circuits 510_1 and 510_2. For example, a first unit pixel circuit may be in the parallel unit pixel circuits 510_1 and 510_2. An n-th unit pixel circuit may be in the non-parallel unit pixel circuits 510_3 to 510_N. In this case, the area of the first unit pixel circuit may be less than the area of the n-th unit pixel circuit.

In an example embodiment, the area of each of the non-parallel unit pixel circuits 510_3 to 510_N may be increased as a distance between the shift register unit 100 and each of the non-parallel unit pixel circuits 510_3 to 510_N is increased. For example, 3rd to n-th unit pixel circuits may be the non-parallel unit pixel circuits 510_3 to 510_N. In this case, the area of the k-th unit pixel circuit may be less than the area of the n-th unit pixel circuit In an example embodiment, the parallel unit pixel circuits 510_1 and 510_2 may receive the scanline enable signal S_EN from the output buffer unit 300. In an example embodiment, the non-parallel unit pixel circuits 510_3 to 510_N may receive the scan enable signal through a scanline connected to the output buffer unit 300.

Figure 18:
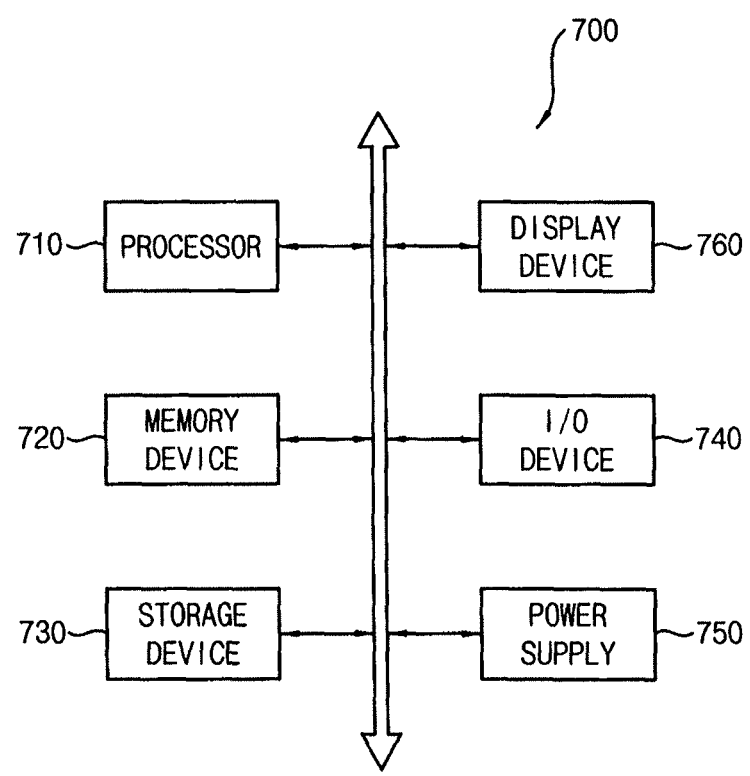
FIG. 18 illustrates an embodiment of a mobile device.

FIG. 18 illustrates an embodiment of a mobile device 700 which includes a processor 710, a memory device 720, a storage device 730, an input/output (I/O) device 740, a power supply 750, and an electroluminescent display device 760. The mobile device 700 may further include a plurality of ports for communicating a video card, a sound card, a memory card, a universal serial bus (USB) device, or other electronic systems.

The processor 710 may perform various computing functions or tasks. The processor 710 may be for example, a microprocessor, a central processing unit (CPU), etc. The processor 710 may be connected to other components via an address bus, a control bus, a data bus, etc. Further, the processor 710 may be coupled to an extended bus such as a peripheral component interconnection (PCI) bus.

The memory device 720 may store data for operations of the mobile device 700. For example, the memory device 720 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano-floating gate memory (NFGM) device, a polymer random access memory (PoRAM) device, a magnetic random access memory (MRAM) device, a ferroelectric random access memory (FRAM) device, and/or at least one volatile memory device such as a dynamic random access memory (DRAM) device, a static random access memory (SRAM) device, a mobile dynamic random access memory (mobile DRAM) device, etc.

The storage device 730 may be, for example, a solid state drive (SSD) device, a hard disk drive (HDD) device, a CD-ROM device, etc. The I/O device 740 may be, for example, an input device such as a keyboard, a keypad, a mouse, a touch screen, and/or an output device such as a printer, a speaker, etc. The power supply 750 may supply power for operating the mobile device 700. The electroluminescent display device 760 may communicate with other components via the buses or other communication links.

The present embodiments may be applied to any mobile device or any computing device. For example, the present embodiments may be applied to a cellular phone, a smart phone, a tablet computer, a personal digital assistant (PDA), a portable multimedia player (PMP), a digital camera, a music player, a portable game console, a navigation system, a video phone, a personal computer (PC), a server computer, a workstation, a tablet computer, a laptop computer, etc.

In accordance with one or more of the aforementioned embodiments, the scanline driver 10*a* may decrease an area of scanline driver 10*a* in a display edge by placing an output buffer unit 300 in a vertical side of the pixel circuit region 500 in a pixel array.

By way of summation and review, one type of scanline driver has an output buffer unit placed between the pixel circuits and the shift register unit. In accordance with one or more of the aforementioned embodiments, a scanline driver includes a shift register unit and an output buffer unit. The pixel circuit region is formed by a plurality of unit pixel circuits that are connected to a scanline. The output buffer unit provides a scanline enable signal to the scanline based on the register output signal and the plurality of signals. The output buffer unit is placed in at least one vertical side of the pixel circuit region in a pixel array. The scanline driver may decrease an area of scanline driver in a display edge by placing an output buffer unit in a vertical side of the pixel circuit region in a pixel array.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A scanline driver for a display device including a plurality of pixel rows, comprising:
   a shift register circuit to provide a register output signal and a plurality of signals based on a scan input signal and a plurality of clock signals, the shift register circuit at at least one horizontal side of a pixel circuit region in which one of the pixel rows is located, the one of the pixel rows connected to a scanline; and
   an output buffer to provide a scanline enable signal to the scanline based on the register output signal and the plurality of signals, the output buffer at at least one vertical side of the pixel circuit region in a pixel array, the output buffer located between adjacent ones of the pixel rows.

2. The scanline driver as claimed in claim 1, wherein:
   the at least one horizontal side is one of a right side or a left side of the pixel circuit region, and
   the at least one vertical side is at one of an upper side or a lower side of the pixel circuit region.

3. The scanline driver as claimed in claim 1, wherein:
   the shift register circuit includes a first shift register circuit and a second shift register circuit, the first shift register circuit at a first horizontal side of the pixel circuit region and the second shift register circuit at a second horizontal side of the pixel circuit region, and
   the output buffer includes a first output buffer and a second output buffer at at least one vertical side.

4. The scanline driver as claimed in claim 3, wherein:
   the first horizontal side at a left side of the pixel circuit region,
   the second horizontal side is at a right side of the pixel circuit region, and
   the at least one vertical side is one of an upper side or a lower side of the pixel circuit region.

5. The scanline driver as claimed in claim 3, wherein:
   the first output buffer is at a lower side of the pixel circuit region, and
   the second output buffer is at an upper side of the pixel circuit region.

6. The scanline driver as claimed in claim 1, wherein the shift register and the output buffer include p-type transistors.

7. The scanline driver as claimed in claim 1, wherein the shift register and the output buffer include n-type transistors.

8. A scanline driver for a display device including a plurality of pixel rows, comprising:
   a shift register circuit to provide a register output signal and a plurality of signals based on a scan input signal and a plurality of clock signals, the shift register circuit at at least one horizontal side of a pixel circuit region in which one of the pixel rows is located, the one of the pixel rows connected to a scanline; and
   an output buffer to provide a scanline enable signal to the scanline based on the register output signal and the plurality of signals, the output buffer including:
   a capacitor circuit between the at least one horizontal side of the pixel circuit region and the shift register circuit, the capacitor circuit including a plurality of capacitors; and
   a transistor circuit at at least one vertical side of the pixel circuit region in a pixel array, the transistor circuit located between adjacent ones of the pixel rows, the transistor circuit including a plurality of transistors.

9. The scanline driver as claimed in claim 8, wherein:
   the at least one horizontal side is one of a right side or a left side of the pixel circuit region, and
   the at least one vertical side is one of an upper side or a lower side of the pixel circuit region.

10. The scanline driver as claimed in claim 8, wherein:
    the shift register circuit includes a first shift register circuit and a second shift register circuit,
    the output buffer includes a first output buffer and a second output buffer,
    the first output buffer includes a first capacitor circuit and a first transistor circuit,
    the second output buffer includes a second capacitor circuit and a second transistor circuit,
    the first shift register circuit and the first capacitor circuit are at a first horizontal side of the pixel circuit region,
    the second shift register circuit and the second capacitor circuit are at a second horizontal side of the pixel circuit region, and
    the first transistor circuit and the second transistor circuit are at the at least one vertical side.

11. The scanline driver as claimed in claim 10, wherein:
    the first horizontal side is a left side of the pixel circuit region,
    the second horizontal side is a right side of the pixel circuit region,
    the at least one vertical side is one of an upper side or a lower side of the pixel circuit region.

12. The scanline driver as claimed in claim 10, wherein:
    the first transistor unit is at a lower side of the pixel circuit region, and
    the second transistor circuit is at an upper side of the pixel circuit region.

13. The scanline driver as claimed in claim 8, wherein:
    the shift register circuit and the transistor circuit include p-type transistors or n-type transistors.

14. A display device, comprising:
    a plurality of scanline drivers to provide a scanline enable signal to a plurality of scanlines based on a scan input signal and a plurality of clock signals; and
    a pixel circuit including a plurality of pixel rows, each pixel row including a plurality of unit pixel circuits to drive organic light emitting diodes and connected at least one of the scanlines, each scanline driver including:
    a shift register circuit to provide a register output signal and a plurality of signals based on the scan input signal and the plurality of clock signals, the shift register circuit at at least one horizontal side of a pixel circuit region in which one of the pixel rows is located; and
    an output buffer to provide the scanline enable signal to the corresponding one of the scanlines based on the register output signal and the plurality of signals, the output buffer at at least one vertical side of the pixel circuit region in a pixel array, the output buffer located between adjacent ones of the pixel rows.

15. The display device as claimed in claim 14, wherein an area of each of the unit pixel circuits is substantially constant.

16. The display device as claimed in claim 15, wherein:
- a horizontal direction length of each of parallel unit pixel circuits is greater than a horizontal direction length of each of non-parallel unit pixel circuits,
- the parallel unit pixel circuits are in parallel with the output buffer, and
- the non-parallel unit pixel circuits are different from the parallel unit pixel circuits.

17. The display device as claimed in claim 14, wherein:
- an area of each of parallel unit pixel circuits is less than an area of each of non-parallel unit pixel circuits,
- the parallel unit pixel circuits are in parallel with the output buffer, and
- the non-parallel unit pixel are different from the parallel unit pixel circuits.

18. The display device as claimed in claim 17, wherein the area of each of the non-parallel unit pixel circuits increases with increasing distance between the shift register circuit and each of the non-parallel unit pixel circuits.

19. The display device as claimed in claim 17, wherein the parallel unit pixel circuits are to receive the scanline enable signal from the output buffer.

20. The display device as claimed in claim 19, wherein the non-parallel unit pixel circuits are to receive the scanline enable signal through a scanline connected to the output buffer.

* * * * *